United States Patent
Tatsumi

(10) Patent No.: US 10,438,943 B2
(45) Date of Patent: Oct. 8, 2019

(54) FIELD-EFFECT TRANSISTOR AND SEMICONDUCTOR DEVICE

(71) Applicant: SONY SEMICONDUCTOR SOLUTIONS CORPORATION, Kanagawa (JP)

(72) Inventor: Takaaki Tatsumi, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 15/772,591

(22) PCT Filed: Sep. 2, 2016

(86) PCT No.: PCT/JP2016/075900
§ 371 (c)(1),
(2) Date: May 1, 2018

(87) PCT Pub. No.: WO2017/081916
PCT Pub. Date: May 18, 2017

(65) Prior Publication Data
US 2019/0096871 A1 Mar. 28, 2019

(30) Foreign Application Priority Data

Nov. 12, 2015 (JP) ................................. 2015-221949

(51) Int. Cl.
*H01L 27/02* (2006.01)
*H01L 29/78* (2006.01)
(Continued)

(52) U.S. Cl.
CPC ........ *H01L 27/027* (2013.01); *H01L 29/1083* (2013.01); *H01L 29/1087* (2013.01); *H01L 29/66659* (2013.01); *H01L 29/78* (2013.01)

(58) Field of Classification Search
None
See application file for complete search history.

(56) References Cited

U.S. PATENT DOCUMENTS

2003/0227053 A1 12/2003 Nomura et al.

FOREIGN PATENT DOCUMENTS

| CN | 1479374 A | 3/2004 |
|---|---|---|
| JP | 05-136405 A | 6/1993 |

(Continued)

OTHER PUBLICATIONS

Translation JP2007150125 (Year: 2007).*

(Continued)

*Primary Examiner* — Whitney Moore
(74) *Attorney, Agent, or Firm* — CHIP Law Group

(57) ABSTRACT

A field-effect transistor including a gate electrode provided on a first-conductivity-type region of a semiconductor substrate with an insulating film provided between the gate electrode and the first-conductivity-type region, a source region of a second conductivity type provided in the semiconductor substrate on one of sides across the gate electrode, a drain region of the second conductivity type provided in the semiconductor substrate on the other of the sides, the other side facing the one side across the gate electrode, a first region of the first conductivity type provided below the drain region and having a higher concentration than the first-conductivity-type region, a second region of the first conductivity type provided to reach a surface in the semiconductor substrate on the other side and having a higher concentration than the first-conductivity-type region, and an extraction electrode connected to the second region.

11 Claims, 13 Drawing Sheets

(51) Int. Cl.
*H01L 29/66* (2006.01)
*H01L 29/10* (2006.01)

(56) References Cited

FOREIGN PATENT DOCUMENTS

| JP | 2004-015003 A | 1/2004 |
| JP | 2007-150125 A | 6/2007 |
| JP | 2012-094565 A | 5/2012 |
| KR | 10-0902726 B1 | 6/2009 |
| TW | 200401424 A | 1/2004 |

OTHER PUBLICATIONS

International Search Report and Written Opinion of PCT Application No. PCT/JP2016/075900, dated Nov. 22, 2016, 8 pages of ISRWO.

\* cited by examiner

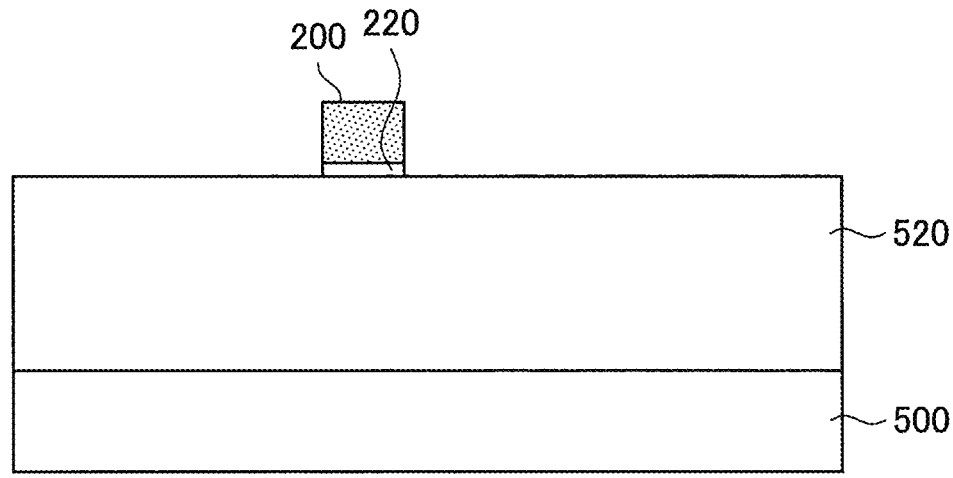
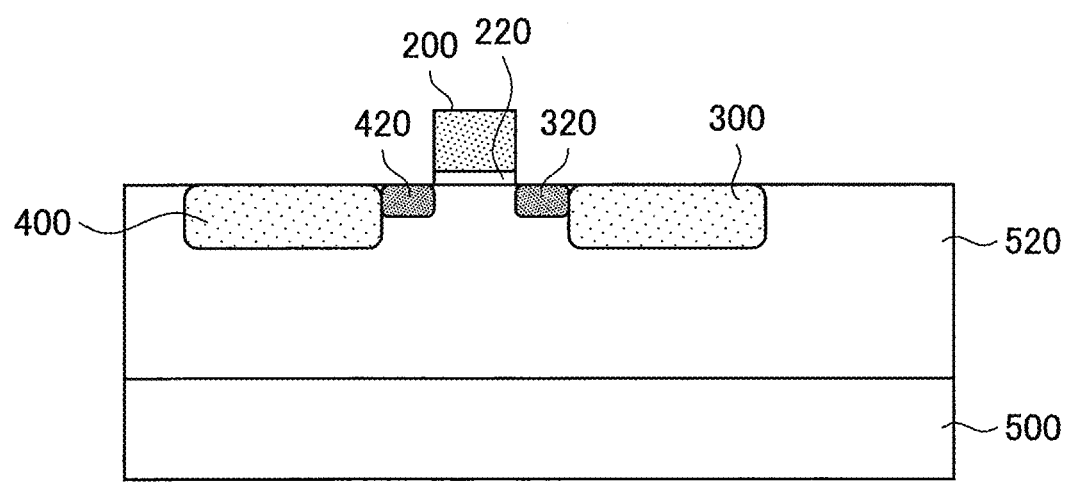

FIELD-EFFECT TRANSISTOR AND SEMICONDUCTOR DEVICE

CROSS REFERENCE TO RELATED APPLICATIONS

This application is a U.S. National Phase of International Patent Application No. PCT/JP2016/075900 filed on Sep. 2, 2016, which claims priority benefit of Japanese Patent Application No. JP 2015-221949 filed in the Japan Patent Office on Nov. 12, 2015. Each of the above-referenced applications is hereby incorporated herein by reference in its entirety.

TECHNICAL FIELD

The present disclosure relates to a field-effect transistor and a semiconductor device.

BACKGROUND ART

In recent years, as structures of semiconductor devices have become finer, it has become increasingly important to protect semiconductor devices from electro static discharge (ESD), which causes malfunction or breaking.

For example, Patent Literature 1 below discloses an ESD protection element including a metal-oxide-semiconductor (MOS) transistor and a diode connected in parallel.

CITATION LIST

Patent Literature

Patent Literature 1: JP 2012-94565A

DISCLOSURE OF INVENTION

Technical Problem

However, the technology disclosed in Patent Literature 1 brings about an increase in production cost, because a diode and a MOS transistor need to be additionally provided as an ESD protection element.

Hence, the present disclosure proposes a novel and improved field-effect transistor and semiconductor device whose ESD resistance can be improved more easily.

Solution to Problem

According to the present disclosure, there is provided a field-effect transistor including: a gate electrode provided on a first-conductivity-type region of a semiconductor substrate with an insulating film provided between the gate electrode and the first-conductivity-type region; a source region of a second conductivity type provided in the semiconductor substrate on one of sides across the gate electrode; a drain region of the second conductivity type provided in the semiconductor substrate on the other of the sides, the other side facing the one side across the gate electrode; a first region of the first conductivity type provided below the drain region and having a higher concentration than the first-conductivity-type region; a second region of the first conductivity type provided to reach a surface in the semiconductor substrate on the other side and having a higher concentration than the first-conductivity-type region; and an extraction electrode connected to the second region.

In addition, according to the present disclosure, there is provided a semiconductor device including a field-effect transistor including a gate electrode provided on a first-conductivity-type region of a semiconductor substrate with an insulating film provided between the gate electrode and the first-conductivity-type region, a source region of a second conductivity type provided in the semiconductor substrate on one of sides across the gate electrode, a drain region of the second conductivity type provided in the semiconductor substrate on the other of the sides, the other side facing the one side across the gate electrode, a first region of the first conductivity type provided below the drain region and having a higher concentration than the first-conductivity-type region, a second region of the first conductivity type provided to reach a surface in the semiconductor substrate on the other side and having a higher concentration than the first-conductivity-type region, and an extraction electrode connected to the second region.

According to the present disclosure, a field-effect transistor can be prevented from performing bipolar operation after breakdown due to ESD; thus, the field-effect transistor can be prevented from being broken by heat generation accompanying bipolar operation.

Advantageous Effects of Invention

As described above, according to the present disclosure, ESD resistance of a field-effect transistor and a semiconductor device can be improved more easily.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 11 is a cross-sectional view in a thickness direction of a substrate illustrating production steps of the field-effect transistor according to the modification example.

FIG. 12 is a cross-sectional view in a thickness direction of a substrate illustrating production steps of the field-effect transistor according to the modification example.

MODE(S) FOR CARRYING OUT THE INVENTION

Figure 1:
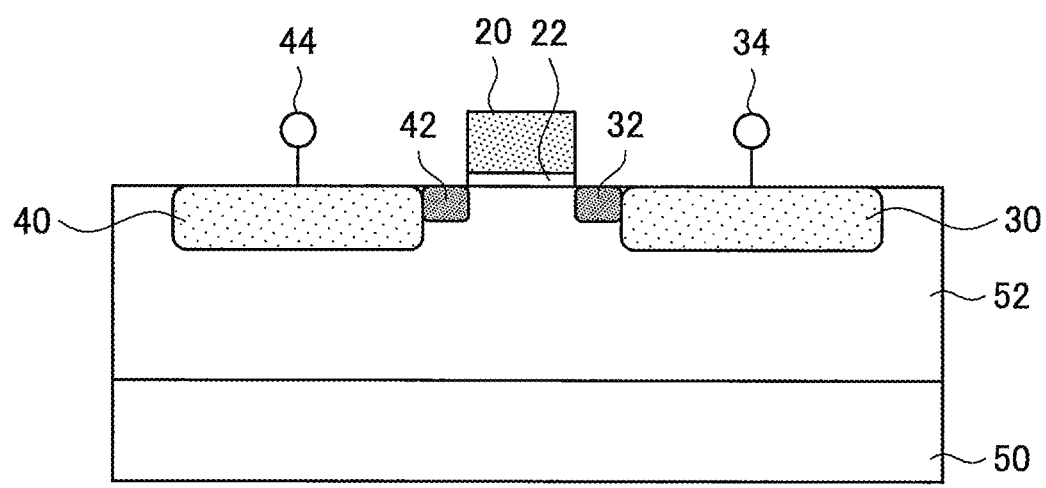
FIG. 1 is a cross-sectional view of a field-effect transistor according to a comparative example taken along a thickness direction of a substrate.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description will be given in the following order.
0. Technical background of present disclosure
1. First embodiment
1.1. Structure of field-effect transistor
1.2. Method for producing field-effect transistor
2. Second embodiment
3. Third embodiment
4. Fourth embodiment
5. Conclusion 0. Technical Background of Present Disclosure First, the technical background of the present disclosure is described with reference to FIGS. 1 to 3. FIG. 1 is a cross-sectional view of a field-effect transistor according to a comparative example taken along a thickness direction of a substrate.

As illustrated in FIG. 1, a field-effect transistor 10 according to the comparative example is, for example, an n-channel metal-oxide-semiconductor field-effect transistor (MOSFET).

A semiconductor substrate 50 includes silicon (Si), for example. In addition, in the semiconductor substrate 50 is formed a well region 52 including p-type (p+) silicon.

A gate electrode 20 is provided on the well region 52 with a gate oxide film 22 therebetween. The gate electrode 20 includes polysilicon or the like, for example, and the gate oxide film 22 includes silicon oxide ($SiO_2$), for example.

In the well region 52 on both sides of the gate electrode 20, a source region 40 and a drain region 30 including n-type (n+) silicon are formed. Extension regions 42 and 32 including low-concentration n-type (n−) silicon are formed between the source region 40 and the gate electrode 20 and between the drain region 30 and the gate electrode 20 in the semiconductor substrate 50.

In addition, a source electrode 44 and a drain electrode 34 including aluminum (Al) or copper (Cu) are connected respectively to the source region 40 and the drain region 30.

In such a field-effect transistor 10, in the case where a surge voltage equal to or greater than a threshold (also referred to as breakdown voltage) is applied to the drain electrode 34 by ESD or the like, a breakdown phenomenon in which surge current flows from the drain electrode 34 to the semiconductor substrate 50 occurs.

Furthermore, in the case where the surge current flowing to the semiconductor substrate 50 causes a potential of the semiconductor substrate 50 to reach a threshold (also referred to as snapback voltage), a parasitic bipolar transistor including the drain region 30, the well region 52, and the source region 40 operates. In such a case, the parasitic bipolar transistor forms a low-impedance current path between a drain and a source; thus, large current flows between the drain and the source, and a voltage between the drain and the source decreases greatly. Such a phenomenon is also called a snapback phenomenon.

Here, in the case where snapback occurs in the field-effect transistor 10, large current flows between a collector and an emitter of the parasitic bipolar transistor; thus, the field-effect transistor 10 is broken by resistive heat that occurs inside the semiconductor substrate 50.

For example, in a semiconductor device of a multi-finger type in which a plurality of field-effect transistors 10 are connected, to prevent the field-effect transistor 10 from being broken by the snapback, providing a p-type (p++) ESD-resistant region having a higher concentration than the well region 52 in a region directly below the drain region 30 has been under consideration.

In such a structure, surge current flows from the drain region 30 to the ESD-resistant region at the time of breakdown, and breakdown voltage decreases. This makes breakdown easily occur in each of the field-effect transistors 10; thus, in the case where surge voltage due to ESD is applied to the semiconductor device, surge current can be distributed to the plurality of field-effect transistors 10.

Consequently, even in the case where surge voltage is applied to the semiconductor device by ESD, excessive surge current can be prevented from flowing in a concentrated manner in one field-effect transistor 10, which can prevent the field-effect transistor 10 from being broken. In addition, it is possible to prevent occurrence of excessive resistive heat in one field-effect transistor 10 to prevent the field-effect transistor 10 from being broken by heat.

Figure 2A:
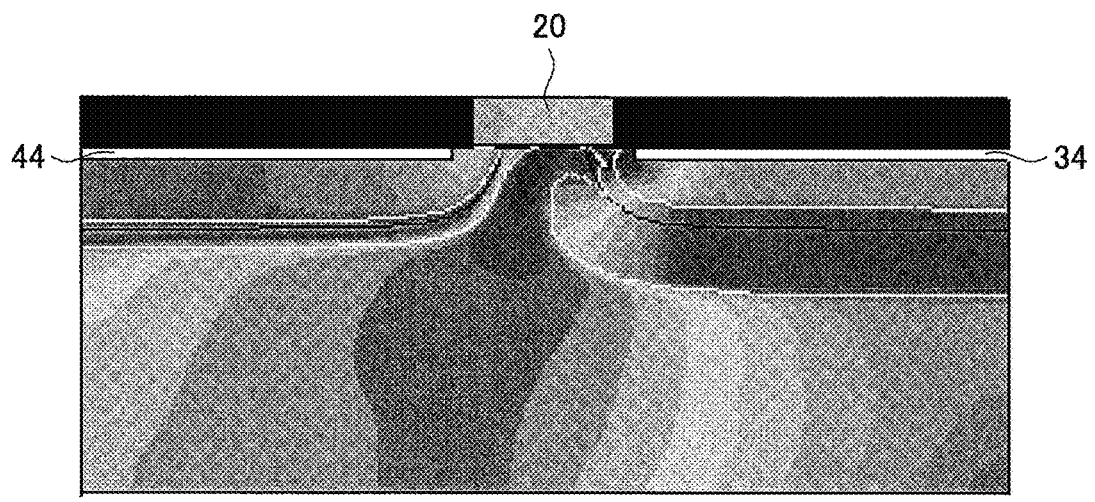
FIG. 2A is a cross-sectional view showing a simulation result of current distribution of the field-effect transistor illustrated in FIG. 1.
Figure 2B:
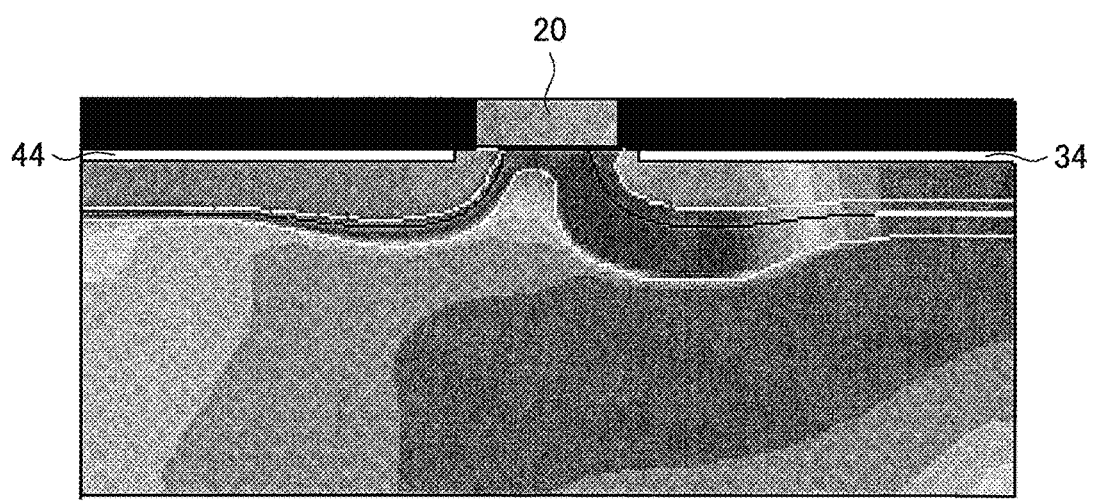
FIG. 2B is a cross-sectional view showing a simulation result of current distribution of a field-effect transistor provided with an ESD-resistant region.

FIGS. 2A and 2B show simulation results of current distribution in field-effect transistors after breakdown. FIG. 2A is a cross-sectional view showing a simulation result of current distribution of the field-effect transistor 10 illustrated in FIG. 1. In addition, FIG. 2B is a cross-sectional view showing a simulation result of current distribution of a field-effect transistor provided with an ESD-resistant region.

In FIGS. 2A and 2B, the source region 40 and the drain region 30 directly below the source electrode 44 and the drain electrode 34 are indicated by being surrounded by a solid line. In addition, in FIGS. 2A and 2B, regions with darker gray indicate regions with higher current density. Note that publicly known simulation software (such as TCAD) was used for the simulation (similar software was used also for all simulations below).

As shown in FIG. 2A, in the field-effect transistor 10 according to the comparative example, current density near an end portion of the drain electrode 34 on the gate electrode 20 side is high. That is, it is found that in the field-effect transistor 10 according to the comparative example, breakdown causes surge current to flow from the end portion of the drain electrode 34 on the gate electrode 20 side to the semiconductor substrate 50. In addition, as shown in FIG. 2B, in the field-effect transistor provided with the ESD-resistant region, current density is high in the drain region 30 and the ESD-resistant region directly below the drain region 30. That is, it is found that in the field-effect transistor provided with the ESD-resistant region, surge current flows to the semiconductor substrate 50 via the ESD-resistant region.

Figure 3:
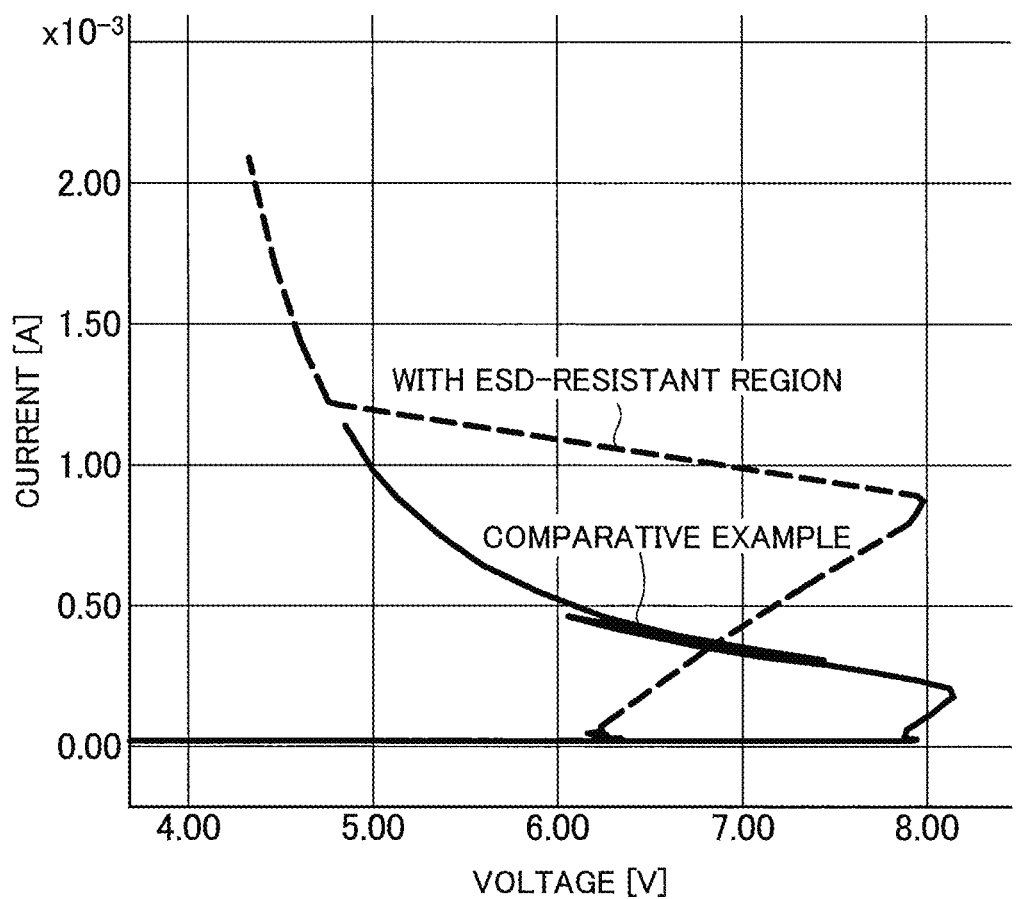
FIG. 3 is a graph showing current-voltage characteristics after breakdown of field-effect transistors.

In addition, FIG. 3 shows simulation results of current-voltage characteristics after breakdown of the field-effect transistor 10 according to the comparative example and the field-effect transistor provided with the ESD-resistant region. FIG. 3 is a graph showing current-voltage characteristics after breakdown of the field-effect transistors. Note that the results shown in FIG. 3 are simulation results obtained in the case where a gate width of the gate electrode 20 is set to 1 μm.

As shown in FIG. 3, in the field-effect transistor that has undergone breakdown at the intercept of the horizontal axis (voltage axis), current that flows increases with a rise in applied voltage. Here, when the voltage reaches approximately 8.0 V, a bipolar transistor parasitic on the field-effect transistor operates, and snapback in which voltage rapidly drops occurs. It is found from the simulation results shown in FIG. 3 that a breakdown voltage of a field-effect transistor is reduced by providing an ESD-resistant region, but a snapback voltage hardly changes.

Consequently, even in the field-effect transistor provided with the ESD-resistant region, it is difficult to prevent the field-effect transistor from being broken by overcurrent, heat generation, or the like after snapback. This is because, even in the case where the ESD-resistant region is provided, the flow of surge current to the semiconductor substrate 50 causes the potential of the semiconductor substrate 50 to rise, so that the snapback phenomenon occurs. In the case where the snapback phenomenon occurs, a bipolar transistor parasitic on the field-effect transistor 10 operates and large current flows; thus, the field-effect transistor 10 is broken by excessive heat generation. Particularly in the case where ESD resistance of the field-effect transistor is low, the field-effect transistor is broken at the same time as occurrence of the snapback phenomenon in some cases.

Therefore, to prevent the field-effect transistor from being broken by surge current due to ESD, it is important to prevent a bipolar transistor parasitic on the field-effect transistor from operating.

The present inventors have devised a technology according to the present disclosure by obtaining the above finding. The technology according to the present disclosure prevents a field-effect transistor from performing bipolar operation after breakdown due to ESD, thereby preventing the field-effect transistor from being broken by heat generation accompanying bipolar operation. According to the present disclosure, it is possible to improve ESD resistance of a field-effect transistor and a semiconductor device more easily without using an additional transistor, diode, or the like.

A field-effect transistor according to an embodiment of the present disclosure providing the above-described effect is described in detail below.

1. First Embodiment

<1.1. Structure of Field-Effect Transistor>

Figure 4A:
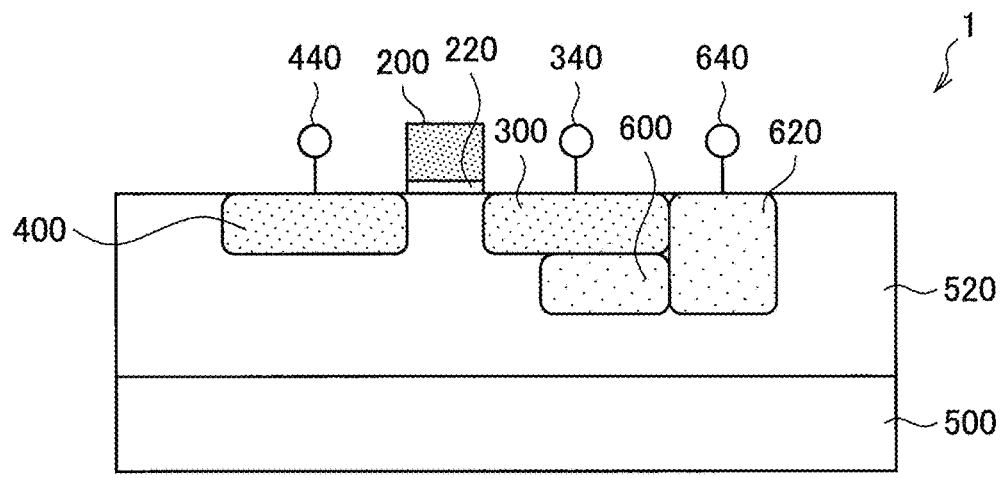
FIG. 4A is a cross-sectional view of a field-effect transistor according to a first embodiment of the present disclosure taken along a thickness direction of a substrate.

First, a field-effect transistor according to a first embodiment of the present disclosure will be described with reference to FIGS. 4A and 4B. FIG. 4A is a cross-sectional view of a field-effect transistor 1 according to the present embodiment taken along a thickness direction of a substrate, and FIG. 4B is a plan view of the field-effect transistor 1 in FIG. 4A in planar view with respect to the substrate.

Figure 4B:
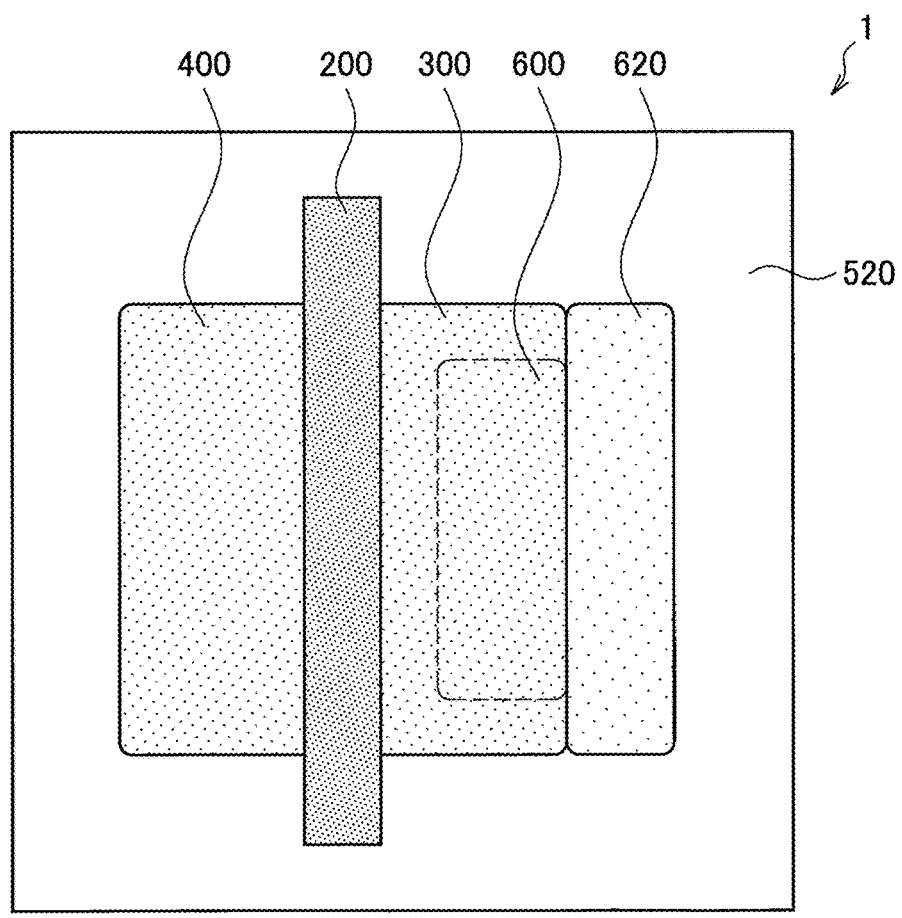
FIG. 4B is a plan view of the field-effect transistor in FIG. 4A in planar view with respect to the substrate.

As illustrated in FIGS. 4A and 4B, the field-effect transistor 1 includes a first-conductivity-type region 520 provided on a semiconductor substrate 500, a gate electrode 200 provided on the first-conductivity-type region 520 with an insulating film 220 therebetween, a source region 400 and a drain region 300 provided on both sides across the gate electrode 200, a first region 600 provided below the drain region 300, a second region 620 provided in the vicinity of the drain region 300, and a source electrode 440, a drain electrode 340, and an extraction electrode 640 connected respectively to the source region 400, the drain region 300, and the second region 620.

Note that the "first conductivity type" indicates one of "p-type" and "n-type", and the "second conductivity type" indicates the other of "p-type" and "n-type". Described below as an example is a case where the field-effect transistor 1 is a p-channel field-effect transistor, but needless to say, the field-effect transistor 1 may be an n-channel field-effect transistor.

The semiconductor substrate 500 is provided with the first-conductivity-type region 520 of the first conductivity type. For example, in the case where the semiconductor substrate 500 is a silicon (Si) substrate, the first-conductivity-type region 520 is formed in the semiconductor substrate 500 by introducing a p-type impurity such as boron (B). In addition, in the case where the semiconductor substrate 500 is a p-type silicon (Si) substrate, the entire semiconductor substrate 500 serves as the first-conductivity-type region 520. Note that an impurity concentration of the first-conductivity-type region 520 may be, for example, approximately $1.0 \times 10^{12}$ (cm$^{-3}$) to $1.0 \times 10^{14}$ (cm$^{-3}$).

Here, although not illustrated in FIGS. 4A and 4B, an insulating region that electrically separates the field-effect transistor 1 from other elements is provided around the field-effect transistor 1 in planar view of the substrate. The insulating region may be formed using an insulating material such as silicon oxide by, for example, a local oxidation of silicon (LOCOS) method or a shallow trench isolation (STI) method.

The gate electrode 200 is provided on the first-conductivity-type region 520 with the insulating film 220 therebetween. The gate electrode 200 may include polysilicon or the like, for example, or may include a metal having a lower resistance value than polysilicon. The insulating film 220 may include silicon oxide, for example, or may include hafnium oxide or the like having a higher dielectric constant than silicon oxide.

On both sides of the gate electrode 200 are provided the source region 400 and the drain region 300 of the second conductivity type. For example, in the case where the first-conductivity-type region 520 is of the p-type, the source region 400 and the drain region 300 are formed by introducing an n-type impurity such as phosphorus (P) or arsenic (As) to the semiconductor substrate 500 on both sides of the gate electrode 200. Note that an impurity concentration of the source region 400 and the drain region 300 may be, for example, approximately $1.0 \times 10^{18}$ (cm$^{-3}$) to $1.0 \times 10^{20}$ (cm$^{-3}$).

The first region 600 is a region of the first conductivity type having a higher concentration than the first-conductivity-type region 520, and is provided in the semiconductor substrate 500 below the drain region 300. For example, in the case where the first-conductivity-type region 520 is of the p-type, the first region 600 is formed by introducing a p-type impurity such as boron (B) to a region below the drain region 300. The depth at which the first region 600 is provided can be controlled by, for example, controlling energy of the impurity when the first-conductivity-type impurity is introduced. An impurity concentration of the first region 600 may be, for example, approximately $1.0 \times 10^{18}$ (cm$^{-3}$) to $1.0 \times 10^{20}$ (cm$^{-3}$).

The first region 600 may be apart from or adjacent to the drain region 300. In addition, the first region 600 is preferably provided so as not to overlap with the gate electrode 200 in planar view of the substrate. In the case where the first region 600 is provided so as to overlap with the gate electrode 200 in planar view, characteristics of the field-effect transistor 1 may change, which is not preferable.

The second region 620 is a region of the first conductivity type having a higher concentration than the first-conductivity-type region 520, and is provided to reach a surface of the semiconductor substrate 500 in the vicinity of the drain region 300. For example, in the case where the first-conductivity-type region 520 is of the p-type, the second region 620 is formed in the semiconductor substrate 500 by introducing a p-type impurity such as boron (B) to the vicinity of the drain region 300. An impurity concentration of the second region 620 may be, for example, approximately $1.0 \times 10^{18}$ (cm$^{-3}$) to $1.0 \times 10^{20}$ (cm$^{-3}$).

Specifically, the second region 620 may be provided in the semiconductor substrate 500 to be adjacent to the drain region 300 and the first region 600. In addition, the second region 620 may be provided in a direction defining a gate length of the gate electrode 200 in planar view of the substrate, with respect to the first region 600, as illustrated in FIG. 4B.

The source electrode 440, the drain electrode 340, and the extraction electrode 640 are connected respectively to the source region 400, the drain region 300, and the second region 620. For example, the source electrode 440, the drain electrode 340, and the extraction electrode 640 include a metal such as aluminum (Al) or copper (Cu). Note that a low-resistance region including high-concentration second-conductivity-type silicon or silicide may be formed on surfaces of the source region 400 and the drain region 300 in contact with the source electrode 440 and the drain electrode 340, in order to reduce contact resistance. In addition, also on a surface of the second region 620 in contact with the extraction electrode 640, a low-resistance region including high-concentration first-conductivity-type silicon or silicide may be formed in order to reduce contact resistance.

In the field-effect transistor 1, for example, in the case where a surge voltage equal to or greater than a breakdown voltage is applied to the drain electrode 340 by ESD or the like, surge current flows from the drain electrode 340 toward the drain region 300, the first region 600, and the second region 620. This is because the first region 600 and the second region 620 have a higher impurity concentration and lower resistance than the first-conductivity-type region 520. Furthermore, the surge current having flown to the second region 620 is extracted from the extraction electrode 640 to the outside of the semiconductor substrate 500 (e.g., a ground or a power supply).

Specifically, in the case where the field-effect transistor 1 is a p-channel field-effect transistor, the extraction electrode 640 is connected to the ground. In addition, in the case where the field-effect transistor 1 is a p-channel field-effect transistor, the extraction electrode 640 is connected to the power supply. Thus, the extraction electrode 640 can extract surge current to the outside from the semiconductor substrate 500.

Consequently, in the field-effect transistor 1, even in the case where ESD or the like causes surge current to flow to the semiconductor substrate 500, the potential of the semiconductor substrate 500 does not rise, because the surge current can be extracted from the extraction electrode 640. Thus, a bipolar transistor parasitic on the field-effect transistor 1 can be prevented from operating, which can prevent the field-effect transistor 1 from being broken by overcurrent or heat generation.

Figure 5:
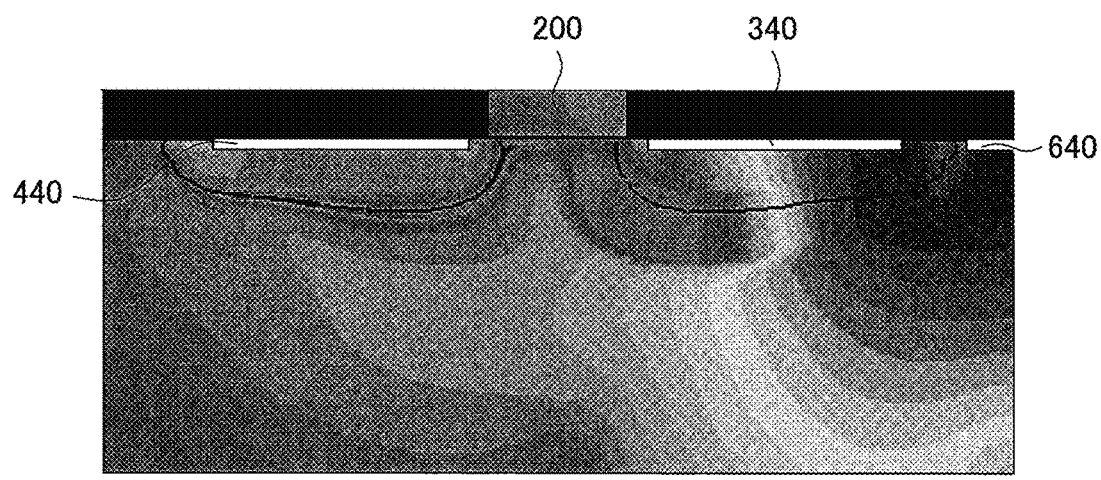
FIG. 5 is a cross-sectional view showing a simulation result of current distribution of a field-effect transistor.

Here, FIG. 5 shows a simulation result of current distribution in the field-effect transistor 1 after breakdown. FIG. 5 is a cross-sectional view showing a simulation result of current distribution of the field-effect transistor 1. In FIG. 5, the source region 400 and the drain region 300 directly below the source electrode 440 and the drain electrode 340 are indicated by being surrounded by a solid line. In addition, in FIG. 5, regions with darker gray indicate regions with higher current density.

As shown in FIG. 5, in the field-effect transistor 1 according to the present embodiment, current density between the drain electrode 340 and the extraction electrode 640 is high. That is, it is found that in the field-effect transistor 1 according to the present embodiment, breakdown causes surge current to flow from the drain electrode 340 to the extraction electrode 640 via the first region 600 and the second region 620.

Figure 6:
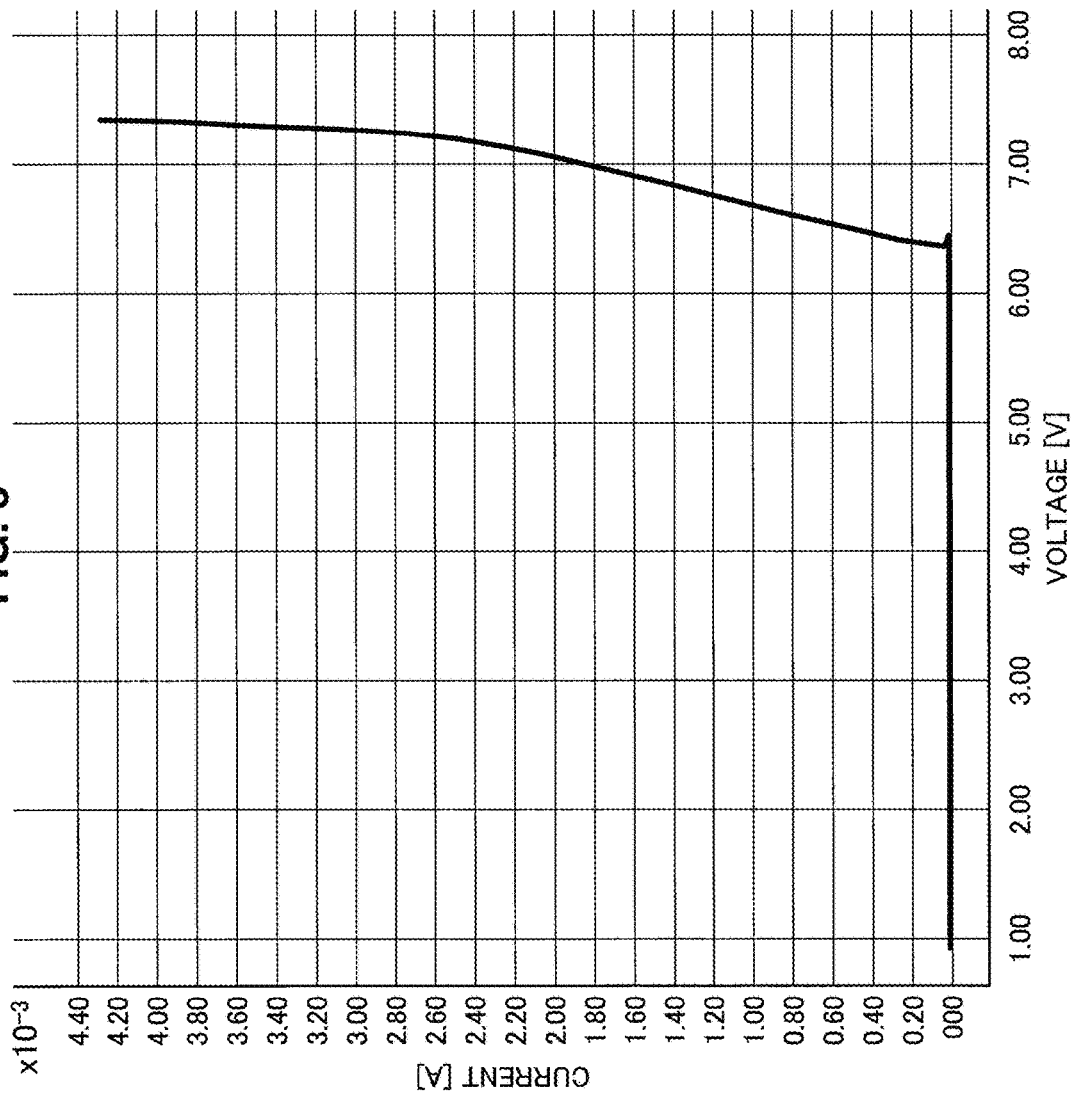
FIG. 6 is a graph showing current-voltage characteristics after breakdown of a field-effect transistor.

In addition, FIG. 6 shows a simulation result of current-voltage characteristics after breakdown of the field-effect transistor 1 according to the present embodiment. FIG. 6 is a graph showing current-voltage characteristics after breakdown of the field-effect transistor 1. Note that the simulation result shown in FIG. 6 is a result obtained in the case where a gate width of the gate electrode 20 is set to 1 µm.

As shown in FIG. 6, in the field-effect transistor 1 that has undergone breakdown at the intercept of the horizontal axis (voltage axis), current that flows increases with a rise in applied voltage. However, it is found that in the field-effect transistor 1 according to the present embodiment, a parasitic bipolar transistor does not operate, so that a snapback phenomenon in which voltage rapidly drops does not occur.

Figure 7:
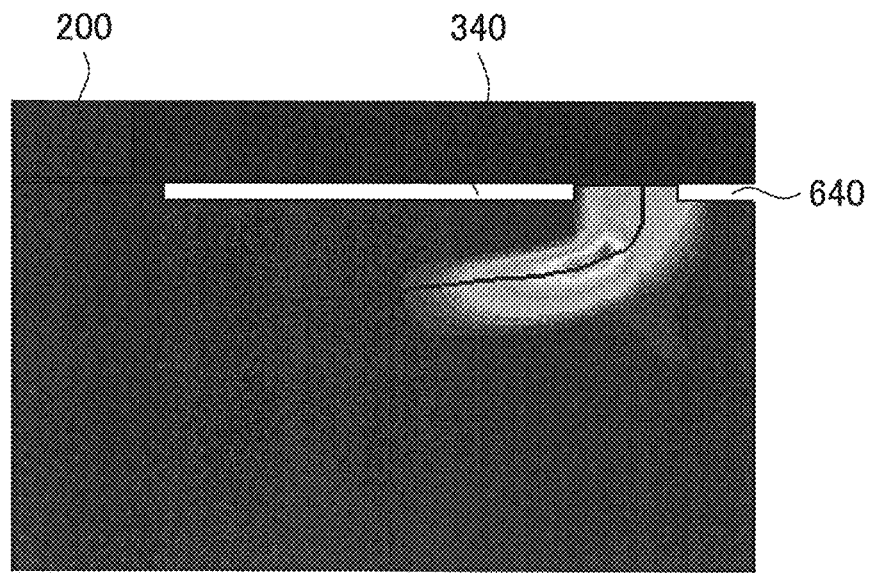
FIG. 7 is a graph showing a simulation result of an amount of heat generation after breakdown of the field-effect transistor according to the embodiment.
Figure 8:
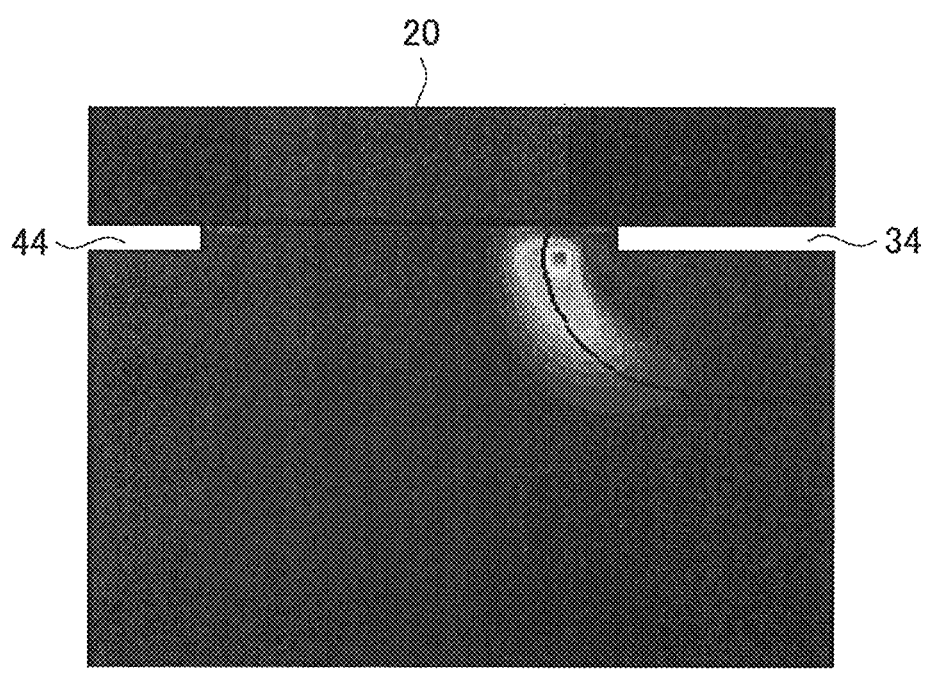
FIG. 8 is a graph showing a simulation result of an amount of heat generation after breakdown of the field-effect transistor according to the comparative example.

Furthermore, FIGS. 7 and 8 show simulation results of an amount of heat generation after breakdown of field-effect transistors. FIG. 7 is a graph showing a simulation result of an amount of heat generation after breakdown of the field-effect transistor 1 according to the present embodiment. FIG. 8 is a graph showing a simulation result of an amount of heat generation after breakdown of the field-effect transistor 10 according to the comparative example. Note that FIGS. 7 and 8 are simulation results obtained in the case where a surge current of 2 mA flows per micrometer of a gate width of the gate electrode.

As shown in FIG. 7, it is found that in the field-effect transistor 1 according to the present embodiment, an amount of heat generation of the drain region 300 between the drain electrode 340 and the extraction electrode 640 is large. On the other hand, as shown in FIG. 8, it is found that in the field-effect transistor 10 according to the comparative example, an amount of heat generation of the drain region 300 between the gate electrode 200 and the drain electrode 340 is large.

Here, FIG. 7 and FIG. 8 are compared. In the field-effect transistor 1 according to the present embodiment, a region in which heat is generated covers a wide4 range; thus, the maximum value of the amount of heat generation is reduced. Therefore, it is found that, in the field-effect transistor 1 according to the present embodiment, the possibility of breaking due to heat generation is reduced.

In addition, in the field-effect transistor 1 according to the present embodiment, a position of the region in which heat is generated is deeper than that in the field-effect transistor 10 according to the comparative example. In a field-effect transistor, a contact between a semiconductor substrate and an electrode that is present on a surface of the semiconductor substrate is most susceptible to heat. Therefore, in the field-effect transistor 1 according to the present embodiment, since the region in which heat is generated is away from the surface of the semiconductor substrate, the possibility of the contact between the semiconductor substrate and the electrode being broken by heat generation can be reduced.

Modification Example

Figure 9:
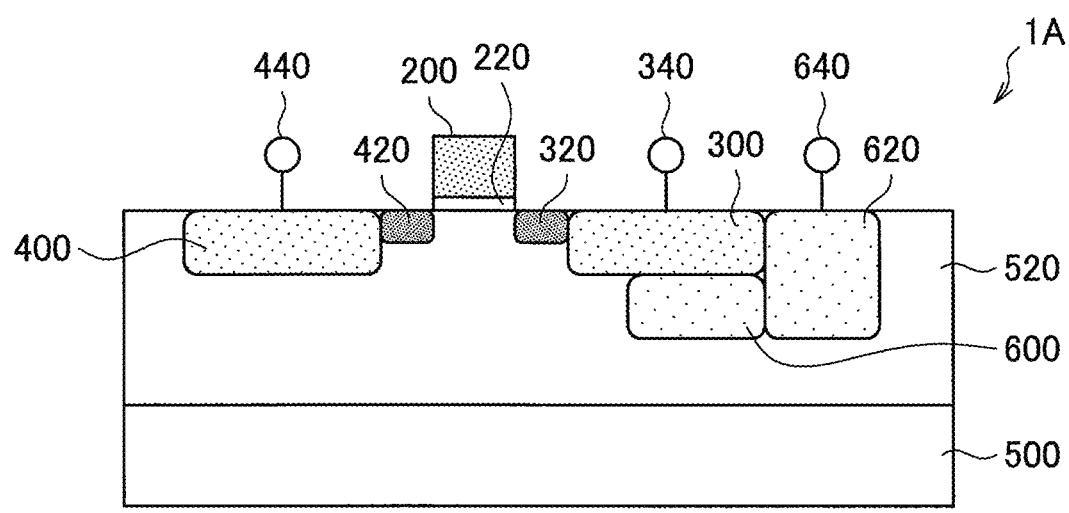
FIG. 9 is a cross-sectional view of a field-effect transistor according to a modification example of the embodiment taken along a thickness direction of a substrate.

In addition, a field-effect transistor 1A according to a modification example of the present embodiment will be described with reference to FIG. 9. FIG. 9 is a cross-sectional view of the field-effect transistor 1A according to the modification example taken along a thickness direction of a substrate.

As illustrated in FIG. 9, the field-effect transistor 1A according to the modification example differs from the field-effect transistor 1 in that low-concentration regions 420 and 320 are provided between the source region 400 and the gate electrode 200 and between the drain region 300 and the gate electrode 200. Note that a configuration of the field-effect transistor 1A according to the modification example is similar to that of the field-effect transistor 1 according to the present embodiment, except for the low-concentration regions 420 and 320; thus, detailed description thereof is omitted here.

The low-concentration regions 420 and 320 are regions of the second conductivity type having a lower concentration than the source region 400 and the drain region 300, and are provided adjacent to the source region 400 and the drain region 300. Providing the low-concentration regions 420 and 320 can relax the strength of an electric field in a channel direction from the source region 400 and the drain region 300, and thus can suppress occurrence of hot carriers. Note that a structure including the low-concentration regions 420 and 320 is also referred to as a lightly doped drain (LDD) structure.

In the field-effect transistor 1A according to the modification example, the first region 600 is preferably provided so as not to overlap with the low-concentration region 320 in planar view of the substrate. In the case where the first region 600 is provided so as to overlap with the low-concentration region 320 in planar view, characteristics of the field-effect transistor 1A change, which is not preferable.

Also in the field-effect transistor 1A having the LDD structure provided with the low-concentration regions 420 and 320 as described above, the technology according to the present disclosure can extract surge current from the semiconductor substrate 500 and prevent a parasitic bipolar transistor from operating. Consequently, like the field-effect transistor 1 according to the present embodiment, the field-effect transistor 1A according to the modification example can reduce the possibility of breaking due to surge current, and thus can improve ESD resistance.

<1.2. Method for Producing Field-Effect Transistor>

Next, a method for producing the field-effect transistor 1A according to the present modification example is described with reference to FIGS. 10 to 15. FIGS. 10 to 15 are cross-sectional views in a thickness direction of a substrate illustrating production steps of the field-effect transistor 1A according to the present modification example. For example, the first conductivity type is p-type and the second conductivity type is n-type, but, needless to say, these may be interchanged.

Figure 10:
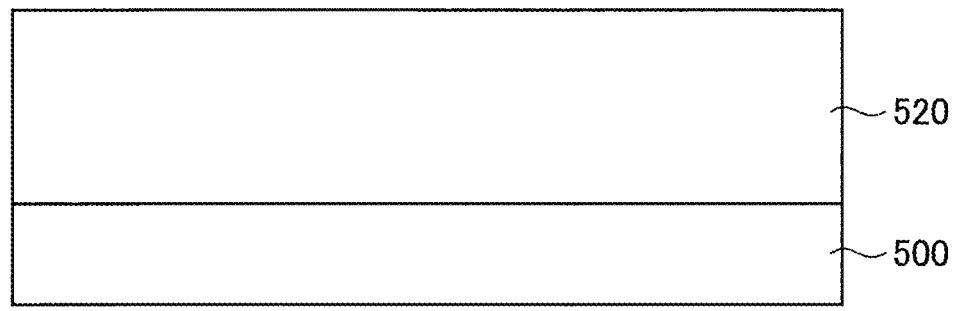
FIG. 10 is a cross-sectional view in a thickness direction of a substrate illustrating production steps of the field-effect transistor according to the modification example.

First, as illustrated in FIG. 10, the semiconductor substrate 500 including Si or the like is prepared. An insulating region is formed in the semiconductor substrate 500 by the STI method or the LOCOS method; thus, a transistor region that is separated by the insulating region and in which the field-effect transistor 1A is to be formed is formed.

Next, in the transistor region of the semiconductor substrate 500, an implantation through film (not illustrated) of a silicon oxide film is formed by a thermal oxidation method or the like, and well implantation of the first conductivity type (e.g., boron or the like) is performed on the region. Note that the implantation through film is removed after the well implantation is performed.

Subsequently, as illustrated in FIG. 11, the insulating film 220 including silicon oxide is formed with a thickness of 5 nm to 10 nm, for example, by a thermal oxidation method or the like. After that, a gate electrode material film (not illustrated) including polysilicon is formed with a thickness of 150 nm to 200 nm, for example, by a chemical vapor deposition (CVD) method or the like. Furthermore, the gate electrode material film is processed by photolithography and etching; thus, the gate electrode 200 is formed on the insulating film 220.

Next, as illustrated in FIG. 12, implantation of the second conductivity type (e.g., arsenic, phosphorus, or the like) is performed using the gate electrode 200 and an offset spacer (not illustrated) as a mask; thus, the low-concentration regions 420 and 320 are formed on both sides of the gate electrode 200. Furthermore, sidewalls (not illustrated) are formed on side surfaces of the gate electrode 200, and then implantation of the second conductivity type is performed. In this manner, the source region 400 and the drain region 300 are formed in the semiconductor substrate 500 on both sides of the gate electrode 200. The sidewalls are removed after the source region 400 and the drain region 300 are formed.

Figure 13:
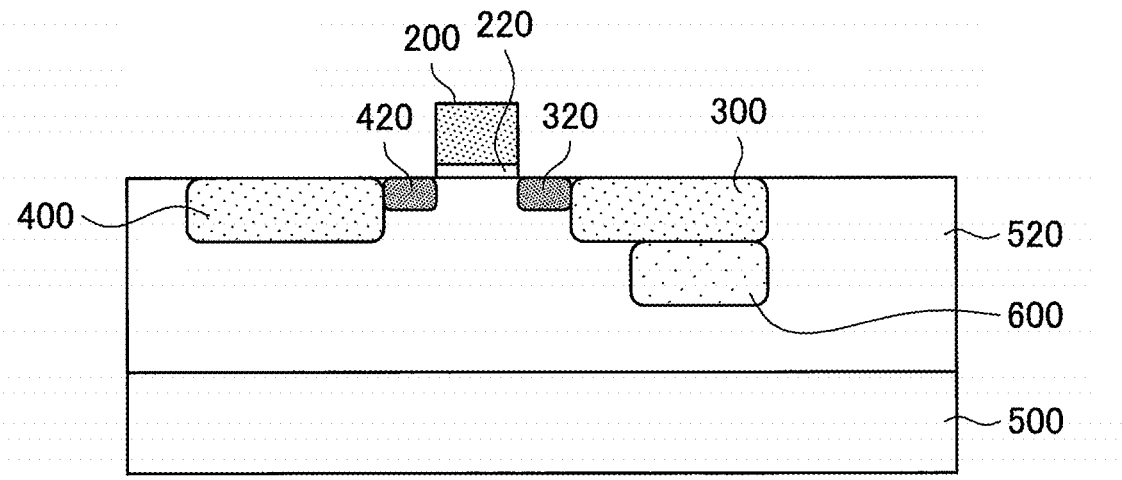
FIG. 13 is a cross-sectional view in a thickness direction of a substrate illustrating production steps of the field-effect transistor according to the modification example.

Subsequently, as illustrated in FIG. 13, implantation of the first conductivity type (e.g., boron or the like) with a higher concentration than that of the first-conductivity-type region 520 is performed; thus, the first region 600 is formed below the drain region 300. Here, the depth at which the first region 600 is formed can be controlled by controlling energy applied to the impurity in the implantation.

Figure 14:
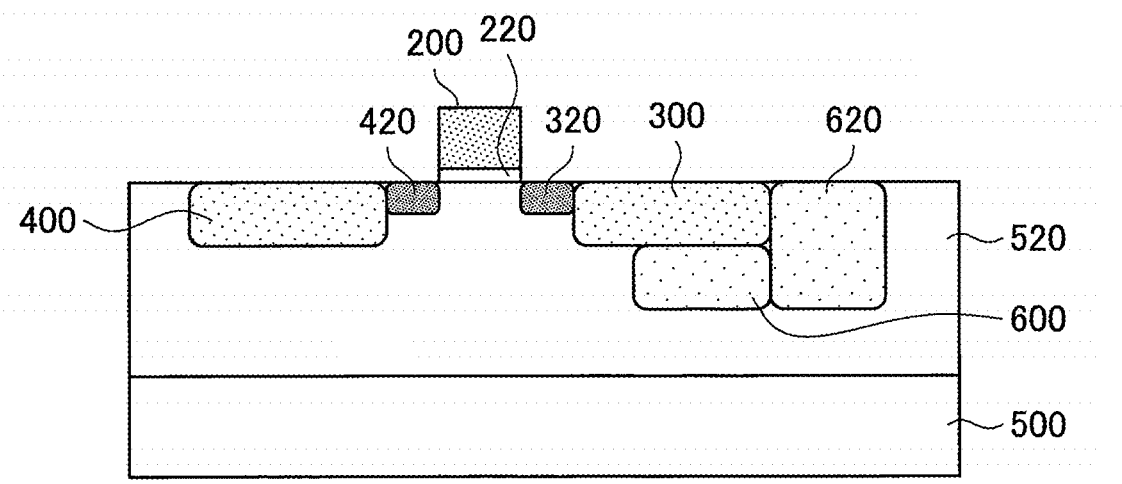
FIG. 14 is a cross-sectional view in a thickness direction of a substrate illustrating production steps of the field-effect transistor according to the modification example.

Next, as illustrated in FIG. 14, implantation of the first conductivity type (e.g., boron or the like) with a higher concentration than that of the first-conductivity-type region 520 is performed on the vicinity of the first region 600 in planar view; thus, the second region 620 is formed.

Figure 15:
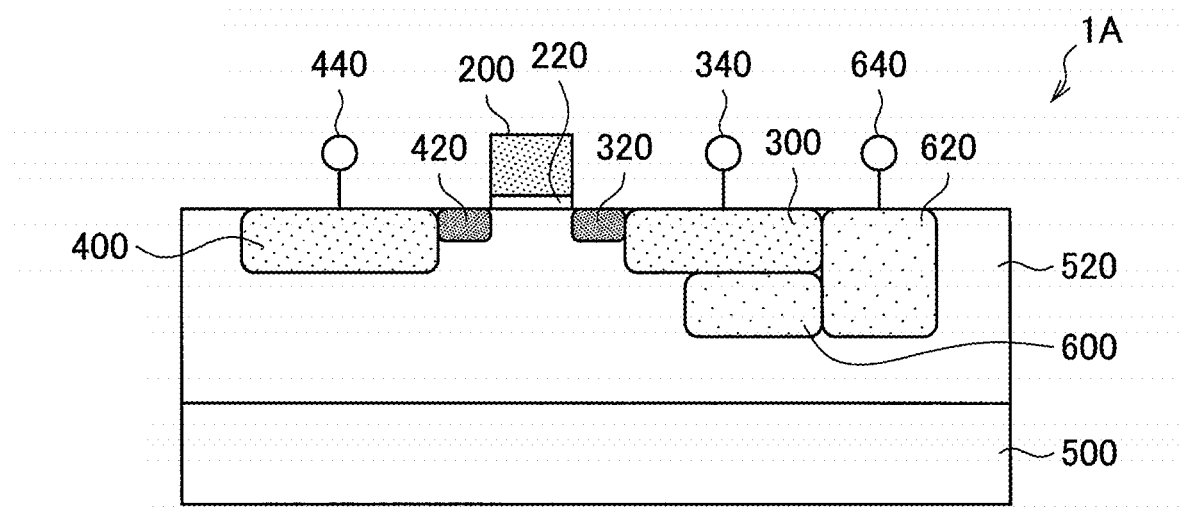
FIG. 15 is a cross-sectional view in a thickness direction of a substrate illustrating production steps of the field-effect transistor according to the modification example.

Furthermore, as illustrated in FIG. 15, the source electrode 440, the drain electrode 340, and the extraction electrode 640 to be connected respectively to the source region 400, the drain region 300, and the second region 620 are formed. The source electrode 440, the drain electrode 340, and the extraction electrode 640 include, for example, aluminum (Al), copper (Cu), or the like.

Note that on surfaces of the source region 400 and the drain region 300, a low-resistance region may be formed by performing implantation of the second conductivity type with a high concentration. In addition, similarly, on a surface of the second region 620, a low-resistance region may be formed by performing implantation of the first conductivity type with a high concentration. The low-resistance regions can reduce contact resistance between the source region 400, the drain region 300, and the second region 620 and the source electrode 440, the drain electrode 340, and the extraction electrode 640.

The method for producing the field-effect transistor 1A according to the present modification example has been described, but a method for producing the field-effect transistor 1A is not limited to the above description. For example, the first region 600 and the second region 620 may be formed before the low-concentration regions 420 and 320, the source region 400, and the drain region 300 are formed.

2. Second Embodiment

Figure 16:
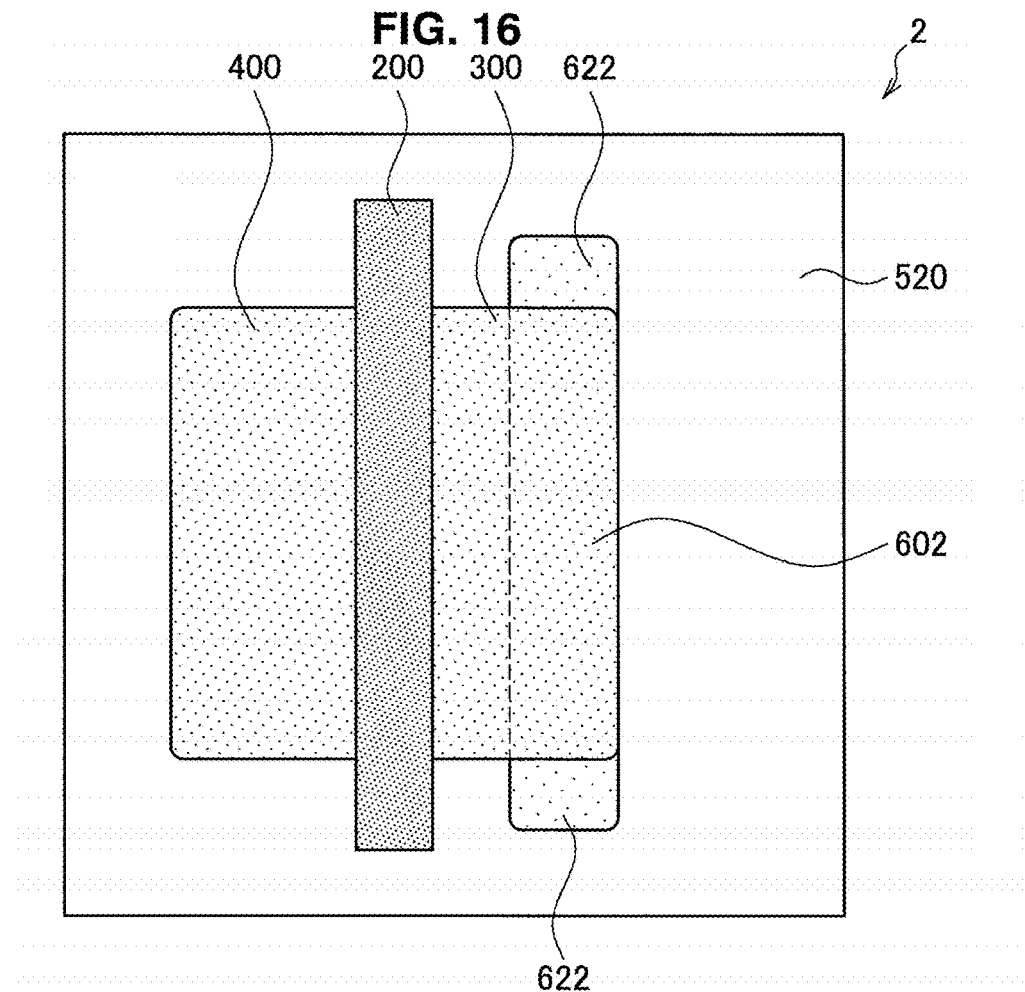
FIG. 16 is a plan view of a field-effect transistor according to a second embodiment of the present disclosure in planar view with respect to a substrate.

Next, a field-effect transistor 2 according to a second embodiment of the present disclosure will be described with reference to FIG. 16. FIG. 16 is a plan view of the field-effect transistor 2 according to the present embodiment in planar view with respect to a substrate.

As illustrated in FIG. 16, in the field-effect transistor 2 according to the present embodiment, a second region 622 is provided in a direction orthogonal to a direction defining a gate length of the gate electrode 200 in planar view of the substrate, with respect to the first region 600. Note that a structure of a cross-section of the field-effect transistor 2 according to the present embodiment in a thickness direction of the substrate is similar to that of the field-effect transistor 1 according to the first embodiment; thus, description thereof is omitted here.

Specifically, the second region 622 is provided to be adjacent to each of end portions of a first region 602 in a direction orthogonal to a direction defining a gate length of the gate electrode 200. In the field-effect transistor 2 according to the present embodiment, implantation of the first conductivity type is performed on a region partly including the drain region 300 in planar view; thus, the first region 602 and the second region 622 can be formed at the same time. In such a case, a region that overlaps with the drain region 300 in planar view serves as the first region 602, and a region that does not overlap with the drain region 300 in planar view serves as the second region 622.

That is, it is found from the structure of the field-effect transistor 2 according to the present embodiment that, in the technology according to the present disclosure, a planar position of the second region 622 is not particularly limited as long as it is in the vicinity of the first region 602 to the extent that surge current flows from the first region 602.

However, the second region 622 is provided at least on the same side as the drain region 300 with respect to the gate electrode 200.

3. Third Embodiment

Figure 17:
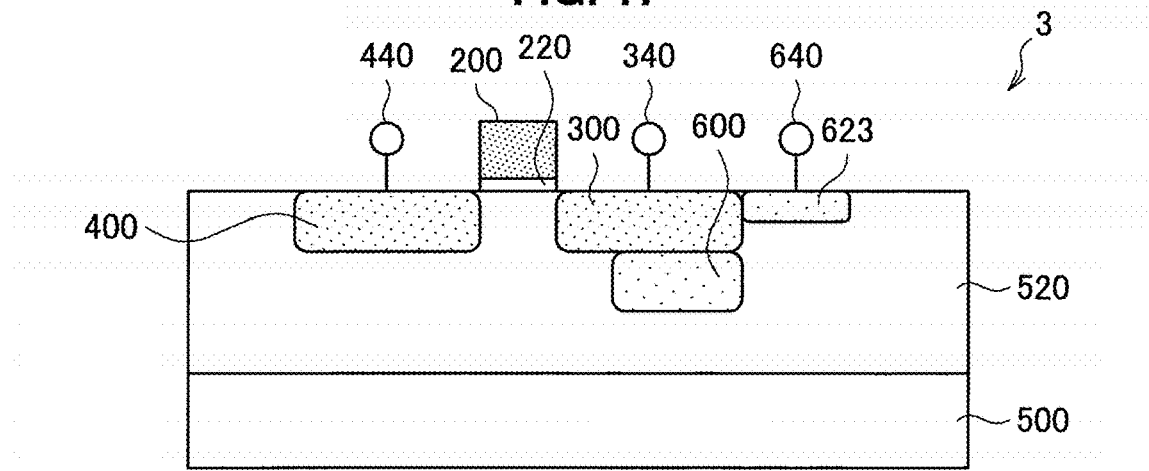
FIG. 17 is a cross-sectional view of a field-effect transistor according to a third embodiment of the present disclosure taken along a thickness direction of a substrate.

Next, a field-effect transistor 3 according to a third embodiment of the present disclosure will be described with reference to FIG. 17. FIG. 17 is a cross-sectional view of the field-effect transistor 3 according to the present embodiment taken along a thickness direction of a substrate. Note that a planar structure of the field-effect transistor 3 according to the present embodiment with respect to the substrate is not particularly limited, and may be any of the structures of the first embodiment and the second embodiment.

As illustrated in FIG. 17, in the field-effect transistor 3 according to the present embodiment, a second region 623 is provided in a region shallower than a depth at which the first region 600 is provided. In such a case, the second region 623 and the first region 600 may be provided apart from each other.

Specifically, as the second region 623, a low-resistance region provided on a surface where the extraction electrode 640 and the semiconductor substrate 500 are in contact with each other may be used. The low-resistance region is a region that is formed by performing implantation of the first conductivity type with a higher concentration than that of the first-conductivity-type region 520, in order to reduce contact resistance between the extraction electrode 640 and the first-conductivity-type region 520. Even in the case where the second region 623 is a low-resistance region formed on the surface of the semiconductor substrate 500, the field-effect transistor 3 can extract, to the outside of the semiconductor substrate 500, surge current that flows from the drain region 300 into the semiconductor substrate 500 via the first region 600.

4. Fourth Embodiment

Figure 18A:
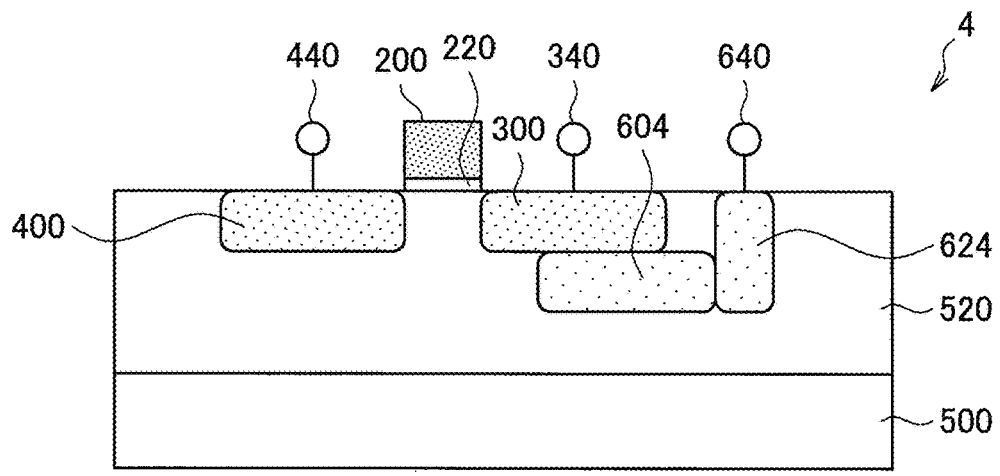
FIG. 18A is a cross-sectional view of a field-effect transistor according to a fourth embodiment of the present disclosure taken along a thickness direction of a substrate.
Figure 18B:
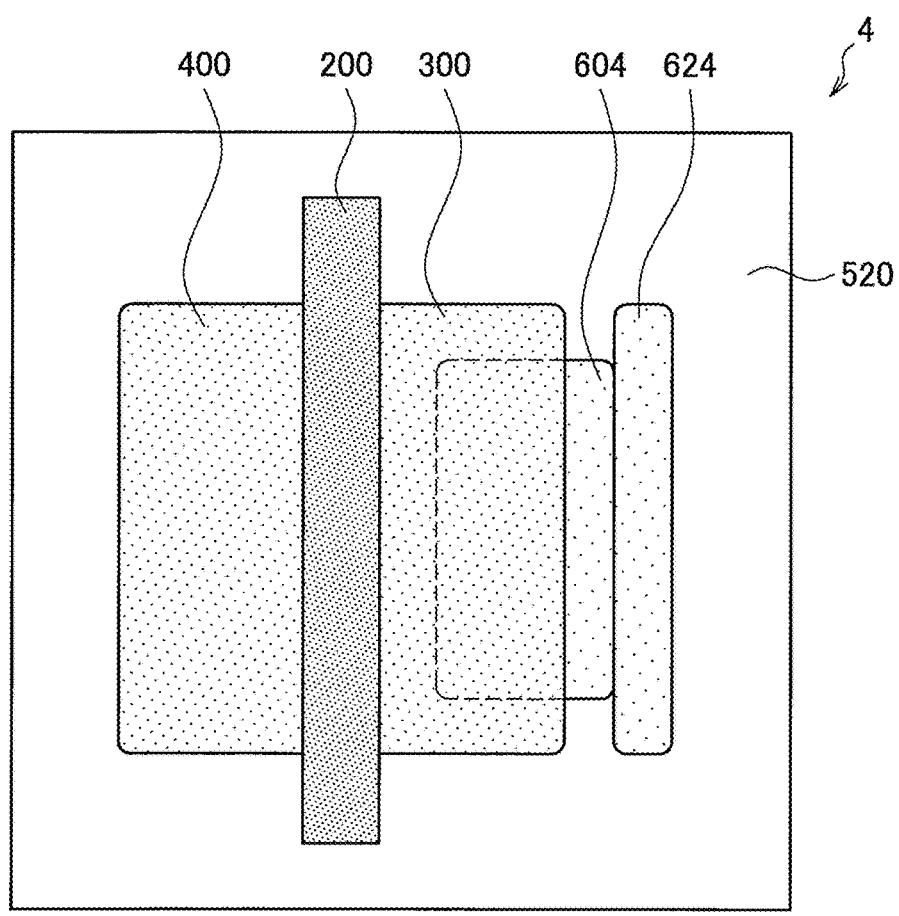
FIG. 18B is a plan view of a field-effect transistor 4 according to the fourth embodiment of the present disclosure in planar view with respect to the substrate.

Next, a field-effect transistor 4 according to a fourth embodiment of the present disclosure will be described with reference to FIGS. 18A and 18B. FIG. 18A is a cross-sectional view of the field-effect transistor 4 according to the present embodiment taken along a thickness direction of a substrate. FIG. 18B is a plan view of the field-effect transistor 4 according to the present embodiment in planar view with respect to the substrate.

As illustrated in FIGS. 18A and 18B, in the field-effect transistor 4 according to the present embodiment, a second region 624 and the drain region 300 are provided apart from each other. With this configuration, the field-effect transistor 4 can suppress, in normal operation without breakdown, leakage current caused by the drain region 300 of the second conductivity type and the second region 624 of the first conductivity type being adjacent to each other.

That is, it is found from the structure of the field-effect transistor 4 according to the present embodiment that, in the technology according to the present disclosure, the drain region 300, a first region 604, and the second region 624 may be adjacent to each other or apart from each other, as long as surge current flows. In the case where the drain region 300, the first region 604, and the second region 624 are adjacent to each other, surge current can be efficiently extracted from the extraction electrode 640 after breakdown. On the other hand, in the case where the drain region 300 and the second region 624 are apart from each other, leakage current from the drain region 300 due to a high-concentration pn junction can be suppressed in normal operation without breakdown.

Note that although FIG. 18B illustrates an example in which the second region 624 is provided in a direction defining a gate length of the gate electrode 200 in planar view of the substrate, with respect to the first region 604, the present embodiment is not limited to the example. For example, the second region 624 may be provided in a direction orthogonal to a direction defining a gate length of the gate electrode 200 in planar view of the substrate, with respect to the first region 604.

5. Conclusion

As described above, according to the technology according to the present disclosure, a field-effect transistor can be prevented from being broken in the case where surge voltage due to ESD is applied, with a more simple structure, without providing an ESD protection element such as a diode.

Therefore, according to the technology according to the present disclosure, a semiconductor device including a field-effect transistor does not need a region for additionally providing an ESD protection element; thus, the semiconductor device can be further reduced in size. In addition, according to the technology according to the present disclosure, a production step of providing an ESD protection element is not needed, which can reduce production cost of a field-effect transistor and a semiconductor device.

In particular, the technology according to the present disclosure can be suitably used for a field-effect transistor having a low breaking current value against surge due to ESD, and can ensure a sufficient breaking current value.

In addition, according to the present disclosure, it is also possible to produce a semiconductor device, such as an integrated circuit element, a solid-state image sensor, a switching circuit element, and an amplifier, including the field-effect transistor according to each of the above embodiments.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A field-effect transistor including:

a gate electrode provided on a first-conductivity-type region of a semiconductor substrate with an insulating film provided between the gate electrode and the first-conductivity-type region;

a source region of a second conductivity type provided in the semiconductor substrate on one of sides across the gate electrode;

a drain region of the second conductivity type provided in the semiconductor substrate on the other of the sides, the other side facing the one side across the gate electrode;

a first region of the first conductivity type provided below the drain region and having a higher concentration than the first-conductivity-type region;

a second region of the first conductivity type provided to reach a surface in the semiconductor substrate on the other side and having a higher concentration than the first-conductivity-type region; and an extraction electrode connected to the second region.

(2)

The field-effect transistor according to (1), in which the second region is provided in a direction defining a gate length of the gate electrode in planar view, with respect to the first region.

(3)

The field-effect transistor according to (1), in which the second region is provided in a direction orthogonal to a direction defining a gate length of the gate electrode in planar view, with respect to the first region.

(4)

The field-effect transistor according to any one of (1) to (3), in which the second region is provided in a region shallower than a depth at which the drain region is provided.

(5)

The field-effect transistor according to any one of (1) to (4), in which the second region and the drain region are provided apart from each other.

(6)

The field-effect transistor according to any one of (1) to (4), in which the drain region, the first region, and the second region are provided adjacent to each other.

(7)

The field-effect transistor according to any one of (1) to (6), further including a low-concentration region of the second conductivity type provided on the gate electrode side to be adjacent to the drain region and having a lower concentration than the drain region, in which the first region is provided in a region that does not overlap with the low-concentration region in planar view.

(8)

A semiconductor device including a field-effect transistor including a gate electrode provided on a first-conductivity-type region of a semiconductor substrate with an insulating film provided between the gate electrode and the first-conductivity-type region, a source region of a second conductivity type provided in the semiconductor substrate on one of sides across the gate electrode, a drain region of the second conductivity type provided in the semiconductor substrate on the other of the sides, the other side facing the one side across the gate electrode, a first region of the first conductivity type provided below the drain region and having a higher concentration than the first-conductivity-type region, a second region of the first conductivity type provided to reach a surface in the semiconductor substrate on the other side and having a higher concentration than the first-conductivity-type region, and an extraction electrode connected to the second region.

REFERENCE SIGNS LIST 1 field-effect transistor
200 gate electrode
220 insulating film 300 drain region
320 low-concentration region
340 drain electrode
400 source region
420 low-concentration region
440 source electrode
500 semiconductor substrate
520 first-conductivity-type region
600 first region
620 second region
640 extraction electrode

The invention claimed is:

1. A field-effect transistor, comprising:
a gate electrode on a specific region of a semiconductor substrate, wherein the specific region is of a first conductivity type;
an insulating film between the gate electrode and the specific region;
a source region of a second conductivity type in the semiconductor substrate on a first side of the gate electrode;
a drain region of the second conductivity type in the semiconductor substrate on a second side of the gate electrode, wherein the second side is opposite to the first side;
a first region of the first conductivity type in the semiconductor substrate is directly adjacent to the drain region, wherein the first region has a higher impurity concentration than the specific region;
a second region of the first conductivity type in contact with a top surface of the semiconductor substrate, wherein
the second region is on the second side, and
the second region has a higher impurity concentration than the specific region; and
an extraction electrode connected to the second region.

2. The field-effect transistor according to claim 1, wherein the second region is in a direction that defines a gate length of the gate electrode in a planar view, with respect to the first region.

3. The field-effect transistor according to claim 1, wherein the second region is in a direction orthogonal to a direction that defines a gate length of the gate electrode in a planar view, with respect to the first region.

4. The field-effect transistor according to claim 1, wherein the second region is shallower than the drain region.

5. The field-effect transistor according to claim 1, wherein the second region is spaced apart from the drain region.

6. The field-effect transistor according to claim 1, wherein the second region is adjacent to each of the first region and the drain region.

7. The field-effect transistor according to claim 1, further comprising a low-concentration region of the second conductivity type on the second side of the gate electrode, wherein
the low-concentration region is adjacent to the drain region,
the low-concentration region has a lower impurity concentration than the drain region, and
the first region is in a non-overlapping manner with the low-concentration region in a planar view.

8. The field-effect transistor according to claim 1, wherein the first region is in a non-overlapping manner with the gate electrode in a planar view.

9. The field-effect transistor according to claim 1, further comprising a low-concentration region of the second conductivity type on the first side of the gate electrode, wherein
the low-concentration region is adjacent to the source region, and
the low-concentration region has a lower impurity concentration than the source region.

10. A semiconductor device, comprising:
a field-effect transistor including:
a gate electrode on a specific region of a semiconductor substrate, wherein the specific region is of a first conductivity type;
an insulating film between the gate electrode and the specific region;
a source region of a second conductivity type in the semiconductor substrate on a first side of the gate electrode;
a drain region of the second conductivity type in the semiconductor substrate on a second side of the gate electrode, wherein the second side is opposite to the first side;
a first region of the first conductivity type in the semiconductor substrate is directly adjacent to the drain region, wherein the first region has a higher impurity concentration than the specific region;
a second region of the first conductivity type in contact with a top surface of the semiconductor substrate, wherein
the second region is on the second side, and
the second region has a higher impurity concentration than the specific region; and
an extraction electrode connected to the second region.

11. A field-effect transistor, comprising:
a gate electrode on a specific region of a semiconductor substrate, wherein the specific region is of a first conductivity type;
an insulating film between the gate electrode and the specific region;
a source region of a second conductivity type in the semiconductor substrate on a first side of the gate electrode;
a drain region of the second conductivity type in the semiconductor substrate on a second side of the gate electrode, wherein the second side is opposite to the first side;
a first region of the first conductivity type in the semiconductor substrate is directly adjacent to the drain region, wherein the first region has a higher impurity concentration than the specific region;
a second region of the first conductivity type in contact with a top surface of the semiconductor substrate, wherein
the second region is on the second side, and
the second region has a higher impurity concentration than the specific region;
an extraction electrode connected to the second region; and
a low-concentration region of the second conductivity type, adjacent to the drain region, on the second side of the gate electrode, wherein
the low-concentration region has a lower impurity concentration than the drain region, and
the first region is in a non-overlapping manner with the low-concentration region in a planar view.

* * * * *